United States Patent
Jain et al.

(10) Patent No.: US 11,557,489 B2
(45) Date of Patent: Jan. 17, 2023

(54) CAVITY STRUCTURES IN INTEGRATED CIRCUIT PACKAGE SUPPORTS

(71) Applicant: Intel Corporation, Santa Clara, CA (US)

(72) Inventors: Rahul Jain, Gilbert, AZ (US); Sai Vadlamani, Chandler, AZ (US); Junnan Zhao, Chandler, AZ (US); Ji Yong Park, Chandler, AZ (US); Kyu Oh Lee, Chandler, AZ (US); Cheng Xu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 997 days.

(21) Appl. No.: 16/113,109

(22) Filed: Aug. 27, 2018

(65) Prior Publication Data

US 2020/0066543 A1 Feb. 27, 2020

(51) Int. Cl.
*H01L 21/48* (2006.01)
*H01L 23/00* (2006.01)
*H01L 23/495* (2006.01)
*H01L 23/31* (2006.01)

(52) U.S. Cl.
CPC .......... *H01L 21/481* (2013.01); *H01L 21/486* (2013.01); *H01L 21/4857* (2013.01); *H01L 23/3121* (2013.01); *H01L 23/49534* (2013.01); *H01L 24/06* (2013.01); *H01L 24/08* (2013.01); *H01L 2224/06181* (2013.01); *H01L 2224/08235* (2013.01); *H01L 2924/15153* (2013.01)

(58) Field of Classification Search
None
See application file for complete search history.

(56) References Cited

U.S. PATENT DOCUMENTS

| | | | | |
|---|---|---|---|---|
| 6,118,178 A * | 9/2000 | Takeuchi | ............... | H01L 23/36 257/730 |
| 6,583,834 B1 * | 6/2003 | Uchiyama | ............... | H01L 24/81 349/122 |
| 7,435,108 B1 * | 10/2008 | Eldridge | ............ | G01R 1/06727 439/81 |
| 9,269,673 B1 * | 2/2016 | Lin | ......................... | H01L 24/97 |
| 9,349,613 B1 * | 5/2016 | Baloglu | ............... | H01L 21/566 |

(Continued)

FOREIGN PATENT DOCUMENTS

EP 3478033 A1 * 5/2019 ......... H01L 23/5389

*Primary Examiner* — Xanthia C Cunningham
(74) *Attorney, Agent, or Firm* — Akona IP PC (57) ABSTRACT

Disclosed herein are cavity structures in integrated circuit (IC) package supports, as well as related methods and apparatuses. For example, in some embodiments, an IC package support may include: a cavity in a dielectric material, wherein the cavity has a bottom and sidewalls; conductive contacts at the bottom of the cavity, wherein the conductive contacts include a first material; a first peripheral material outside the cavity, wherein the first peripheral material is at the sidewalls of the cavity and proximate to the bottom of the cavity, and the first peripheral material includes the first material; and a second peripheral material outside the cavity, wherein the second peripheral material is at the sidewalls of the cavity and on the first peripheral material, and the second peripheral material is different than the first peripheral material.

20 Claims, 6 Drawing Sheets

(56) References Cited

U.S. PATENT DOCUMENTS

| | | | |
|---|---|---|---|
| 2007/0090434 A1* | 4/2007 | Davies | H01L 21/56 |
| | | | 257/E29.066 |
| 2009/0314650 A1* | 12/2009 | Tseng | H01L 21/486 |
| | | | 205/205 |
| 2013/0001783 A1* | 1/2013 | Yu | H01L 23/481 |
| | | | 438/653 |
| 2013/0249115 A1* | 9/2013 | Lin | H01L 21/56 |
| | | | 257/E23.141 |
| 2016/0240481 A1* | 8/2016 | Chen | H01L 21/486 |
| 2016/0379935 A1* | 12/2016 | Shih | H01L 23/3736 |
| | | | 257/738 |
| 2017/0186678 A1* | 6/2017 | Lin | H01L 23/49816 |
| 2017/0358847 A1* | 12/2017 | Cho | H05K 1/18 |
| 2018/0282153 A1* | 10/2018 | Heller | H01L 24/02 |
| 2018/0366424 A1* | 12/2018 | Borrego Lambin Torres Amaral | B81B 7/0025 |
| 2019/0079567 A1* | 3/2019 | Antoniswamy | H01L 23/36 |
| 2019/0124772 A1* | 4/2019 | Stahr | H05K 1/185 |
| 2019/0206824 A1* | 7/2019 | Lu | H01L 21/568 |

* cited by examiner

CAVITY STRUCTURES IN INTEGRATED CIRCUIT PACKAGE SUPPORTS

BACKGROUND

Integrated circuit (IC) package supports, including package substrates and interposers, may have components disposed on their faces or embedded therein.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Disclosed herein are cavity structures in integrated circuit (IC) package supports, as well as related methods and apparatuses. For example, in some embodiments, an IC package support may include: a cavity in a dielectric material, wherein the cavity has a bottom and sidewalls; conductive contacts at the bottom of the cavity, wherein the conductive contacts include a first material; a first peripheral material outside the cavity, wherein the first peripheral material is at the sidewalls of the cavity and proximate to the bottom of the cavity, and the first peripheral material includes the first material; and a second peripheral material outside the cavity, wherein the second peripheral material is at the sidewalls of the cavity and on the first peripheral material, and the second peripheral material is different than the first peripheral material.

In some existing IC package substrates, a solid block of copper may be embedded in the package substrate to act as a laser stop for the formation of a cavity in the package substrate. If an IC component is placed in this cavity, the presence of the copper block at the bottom of the cavity may prevent electrical connections being made to the IC component through the bottom of the cavity, limiting the design flexibility and therefore constraining the achievable performance.

The cavity structures and IC package supports disclosed herein may improve the design options available to IC package designers, and may enable more efficient routing of signals and/or power through an IC package support. For example, in some embodiments, the cavity structures and IC package supports disclosed herein may improve the quality and efficiency of power delivery in computing device packages, enabling high performance computing methods (e.g., virtual and augmented reality, artificial intelligence, real-time sensor integration, etc.). Further, the cavity structures and IC package supports disclosed herein may enable the use of double-sided IC components, or IC components previously considered too large for integration into an IC package.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 3" may be used to refer to the collection of drawings of FIGS. 3A-3Q. As used herein, an "IC package support" or "package support" may refer to a structure included in an IC package that provides mechanical and/or electrical support to one or more dies or other electrical components (e.g., passive or active components) included in the IC package. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

Figure 1:
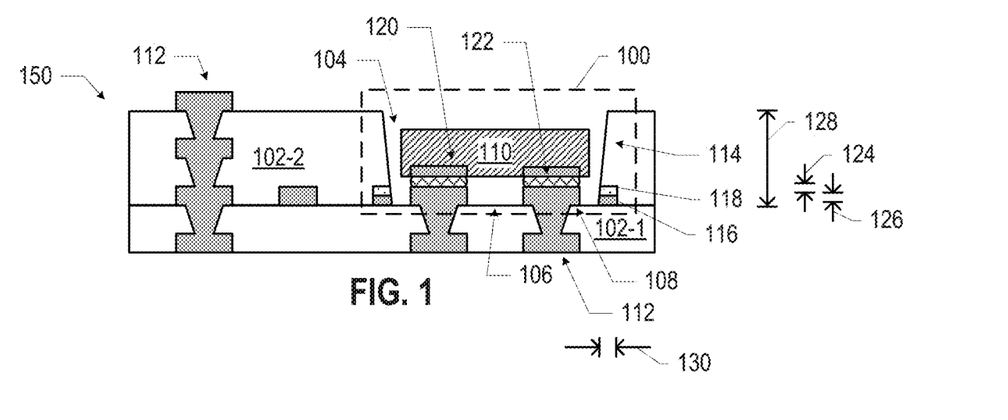
FIG. 1 is a side, cross-sectional view of a portion of an integrated circuit (IC) package support including a cavity structure, in accordance with various embodiments.

FIG. 1 is a side, cross-sectional view of a portion of an IC package support 150 including a cavity structure 100. The IC package support 150 may be a package substrate (e.g., the package substrate 151 discussed below with reference to FIG. 2), an interposer (e.g., the interposer 157 discussed below with reference to FIG. 2), or any other suitable IC package support. In some embodiments, the cavity structure 100 may be disposed at a face of the IC package support 150, while in other embodiments, the cavity structure 100 may be embedded in the IC package support 150. An IC package support 150 may include other structures in and around the portion depicted in FIG. 1 (e.g., as discussed below with reference to FIGS. 3P and 3Q); the particular arrangement of elements shown in FIG. 1 is presented for illustrative purposes.

The IC package support 150 of FIG. 1 may include a dielectric material 102-1 and one or more conductive contacts 108 on a top surface of the dielectric material 102-1. The dielectric material 102-1 may include any suitable dielectric material (e.g., any of the dielectric materials discussed below with reference to the package substrate 151 of FIG. 2), such as a buildup film (e.g., Ajinomoto buildup film) or other organic dielectric, and may include one or more layers of that dielectric material. The conductive contacts 108 may be electrically coupled to conductive structures 112 through the dielectric material 102-1; these conductive structures 112 may include conductive vias and/or conductive lines (e.g., as discussed below with reference to FIG. 5). Other conductive structures 112 including conductive vias and/or lines may extend through the dielectric material 102 of the IC package support 150.

A dielectric material 102-2 may be disposed on the top surface of the dielectric material 102-1. The dielectric material 102-2 may include any suitable dielectric material (e.g., any of the dielectric materials discussed below with reference to the package substrate 151 of FIG. 2), such as a buildup film (e.g., Ajinomoto buildup film) or other organic dielectric, and may include one or more layers of that dielectric material. The dielectric material 102-2 may have the same material composition as the dielectric material 102-1, or may be different. A cavity 104 may extend through the dielectric material 102-2, exposing the conductive contacts 108 and a proximate portion of the top surface of the dielectric material 102-1 at the bottom 106 of the cavity 104. The cavity 104 may be tapered, narrowing toward the conductive contacts 108. In some embodiments, as illustrated in FIG. 1, conductive vias proximate to the cavity 104 may taper in a same direction as the cavity 104.

An IC component 110 may be disposed in the cavity 104, with conductive contacts 120 of the IC component 110 coupled to the conductive contacts 108 by solder 122. In some embodiments, as shown in FIG. 1, the IC component 110 may be entirely disposed within the cavity 104; in other embodiments, the IC component 110 may extend "above" the top of the cavity, beyond the plane of the top surface of the dielectric material 102-2. The IC component 110 may include any packaged or unpackaged IC component. In some embodiments, the IC component 110 may include a die. In some embodiments, the IC component 110 may include an inductor. In some embodiments, the IC component 110 may include a capacitor (e.g., a thin film capacitor (TFC), a multi-layer ceramic capacitor (MLCC), or a chip capacitor). Any other suitable active or passive components may be included in the IC component 110. In some embodiments, power may be delivered to the IC component 110 through the conductive contacts 108 at the bottom of the cavity 104; delivering power to the IC component 110 through the conductive contacts 108 may be a shorter and less lossy pathway than existing approaches in which no electrical connections may be made to an IC component through the bottom of a cavity (and thus power must be routed around and over an IC component to make electrical contact at the top face of the IC component).

Figure 2:
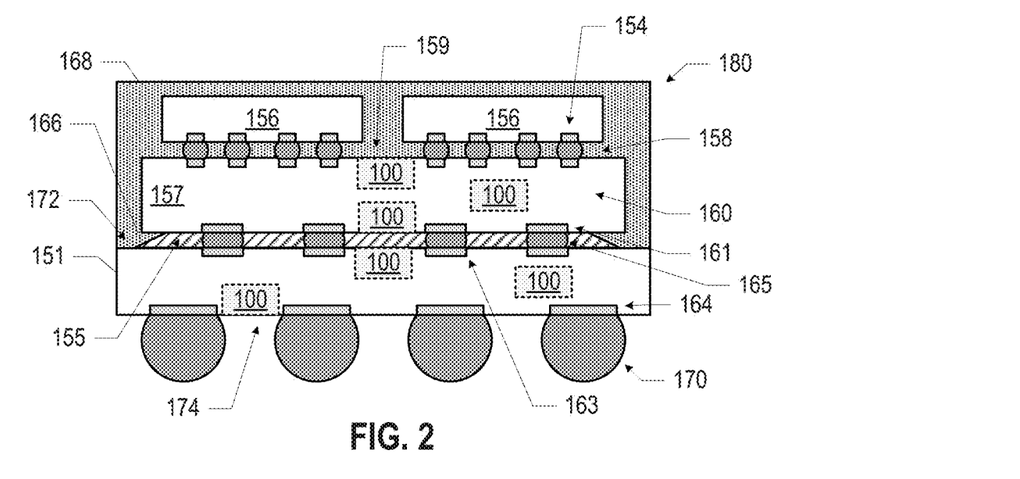
FIG. 2 is a side, cross-sectional view of an IC package including one or more cavity structures, in accordance with various embodiments.

Peripheral materials may be disposed outside the cavity 104, at the sidewalls 114 of the cavity 104 and proximate to the bottom 106 of the cavity 104. FIG. 2 illustrates two peripheral materials 116 and 118, with the peripheral material 116 disposed on the top surface of the dielectric material 102-1 and the peripheral material 118 disposed above the peripheral material 118. As shown in FIG. 1, the peripheral materials 116/118 may be exposed at the sidewalls 114 proximate to the bottom 106 of the cavity 104. The peripheral materials 116/118 may have a ring shape when viewed from the top (not shown) such that the peripheral materials 116/118 may extend around the cavity 104. The peripheral materials 116/118 may not be part of power/ground or signaling pathways through the IC package support 150, and instead may be electrically insulated from such pathways (e.g., by intervening dielectric material 102).

The peripheral material 116 may be a conductive material (e.g., may include a metal). In some embodiments, the peripheral material 116 may include copper. In some embodiments, the peripheral material 116 may have the same material composition as the conductive contacts 108. In some embodiments, the peripheral material 116 may be a portion of a conductive seed layer used during the formation of the conductive contacts (e.g., as discussed further below with reference to FIG. 3).

The peripheral material 118 may have a different material composition than the peripheral material 116. In some embodiments, the peripheral material 116 may be a metal, and the peripheral material 118 may be a different metal. For example, the peripheral material 118 may be nickel, tungsten, or titanium (e.g., when the peripheral material 116 is copper). In some embodiments, the peripheral material 118 may be a material that may serve as a laser stop when forming the cavity 104 (e.g., as discussed further below with reference to FIG. 3).

The dimensions of various ones of the elements of the IC package support 150 of FIG. 1 may take any suitable values. In some embodiments, the depth 128 of the cavity 104 may be between 50 microns and 150 microns. In some embodiments, the thickness 126 of the peripheral material 116 may be between 0.2 microns and 1.5 microns. In some embodiments, the thickness 124 of the peripheral material 118 may be between 5 microns and 15 microns; in other embodiments, the thickness 124 of the peripheral material 118 may be 10 microns or greater. In some embodiments, the width 130 of the peripheral material 116/118 (measured on a portion of the peripheral material 116/118 in a direction perpendicular to the depth 128 of the cavity 104 from the proximate sidewall 114, as indicated in FIG. 1) may be between 5 microns and 20 microns.

The cavity structures 100 disclosed herein may be included in any suitable IC package support 150. For example, FIG. 2 is a side, cross-sectional view of an example IC package 180 that may include one or more cavity structures 100 and IC package supports 150. In some embodiments, the IC package 180 may be a system-in-package (SiP).

The package substrate 151 may be formed of a dielectric material (e.g., a ceramic, a buildup film, an epoxy film having filler particles therein, etc.), and may have conductive structures extending through the dielectric material between the face 172 and the face 174, or between different locations on the face 172, and/or between different locations on the face 174. These conductive structures may take the form of any of the interconnects 1628 discussed below with reference to FIG. 5.

FIG. 2 illustrates three cavity structures 100 in the package substrate 151 (one at the face 172, one at the face 174, and one embedded in the package substrate 151), but this number and location of cavity structures 100 in the IC package 180 is simply illustrative, and any number of cavity structures 100 may be included in a package substrate 151. In some embodiments, no cavity structures 100 may be included in the package substrate 151. When a cavity structure 100 is located at a face 172/174 of the package substrate 151, the cavity 104 may be "open" to the ambient environment, or covered over with a dielectric material (e.g., to mitigate damage). The use of a cavity structure 100 at the face 174 of the package substrate 151 may mitigate or eliminate the need for a corresponding cavity in a face of a circuit board (e.g., a motherboard, not shown) to which the package substrate 151 is attached (via the second-level interconnects 170) to accommodate particularly tall IC components 110. Using some existing cavity techniques, a particularly tall IC component (e.g., a tall inductor or capacitor) may not be able to be sufficiently recessed on the face of an IC package substrate so as to avoid that IC component butting up against the circuit board after the IC package is attached to the circuit board; in such situations, a recess may be created in the circuit board to accommodate the IC component. The cavity structures 100 disclosed herein may allow sufficiently "deep" cavities 104 to be formed so as to accommodate tall IC components 110, reducing or eliminating the use of a corresponding recess in the circuit board. More generally, the cavity structures 100 disclosed herein may accommodate IC components 110 that are larger than those that could be disposed in a cavity in a package substrate using conventional techniques, and therefore the cavity structures 100 and IC package supports 150 disclosed herein may enable the use of larger, higher efficiency components than conventionally achievable.

The package substrate 151 may include conductive contacts 163 that are coupled to conductive structures 1662 through the package substrate 151, allowing circuitry within the dies 156 and/or the interposer 157 to electrically couple to various ones of the conductive contacts 164 (or to other devices included in the package substrate 151, not shown).

The IC package 180 may include an interposer 157 coupled to the package substrate 151 via conductive contacts 161 at a face 155 of the interposer 157, first-level interconnects 165, and the conductive contacts 163 of the package substrate 151. The first-level interconnects 165 illustrated in FIG. 2 are solder bumps, but any suitable first-level interconnects 165 may be used.

FIG. 2 illustrates three cavity structures 100 in the interposer 157 (one at the face 155, one at the face 159, and one embedded in the interposer 157), but this number and location of cavity structures 100 in the IC package 180 is simply illustrative, and any number of cavity structures 100 may be included in an interposer 157. In some embodiments, no cavity structures 100 may be included in the interposer 157. When a cavity structure 100 is located at a face 155/159 of the interposer 157, the cavity 104 may be "open" to the ambient environment, or covered over with a dielectric material (e.g., to mitigate damage).

The IC package 180 may include one or more dies 156 coupled to the interposer 157 via conductive contacts 154 of the dies 156, first-level interconnects 158, and conductive contacts 160 at the face 159 of the interposer 157. The conductive contacts 160 may be coupled to conductive structures (not shown) through the interposer 157, allowing circuitry within the dies 156 to electrically couple to various ones of the conductive contacts 161 (or to other devices included in the interposer 157, not shown). The first-level interconnects 158 illustrated in FIG. 2 are solder bumps, but any suitable first-level interconnects 158 may be used. In some embodiments, no interposer 157 may be included in the IC package 180; instead, the dies 156 may be coupled directly to the conductive contacts 163 at the face 172 of the package substrate 151 by first-level interconnects 165.

In some embodiments, an underfill material 166 may be disposed between the package substrate 151 and the interposer 157 around the first-level interconnects 165, and a mold compound 168 may be disposed around the dies 156 and the interposer 157 and in contact with the package substrate 151. In some embodiments, the underfill material 166 may be the same as the mold compound 168. Example materials that may be used for the underfill material 166 and the mold compound 168 are epoxy mold materials, as suitable. Second-level interconnects 170 may be coupled to the conductive contacts 164. The second-level interconnects 170 illustrated in FIG. 2 are solder balls (e.g., for a ball grid array arrangement), but any suitable second-level interconnects 170 may be used (e.g., pins in a pin grid array arrangement or lands in a land grid array arrangement). The second-level interconnects 170 may be used to couple the IC package 180 to another component, such as a circuit board (e.g., a motherboard), an interposer, or another IC package, as known in the art and as discussed below with reference to FIG. 6.

The dies 156 may take the form of any of the embodiments of the die 1502 discussed herein (e.g., may include any of the embodiments of the IC device 1600). In embodiments in which the IC package 180 includes multiple dies 156, the IC package 180 may be referred to as a multi-chip package (MCP). The dies 156 may include circuitry to perform any desired functionality. For example, one or more of the dies 156 may be logic dies (e.g., silicon-based dies), and one or more of the dies 156 may be memory dies (e.g., high bandwidth memory).

Although the IC package 180 illustrated in FIG. 2 is a flip chip package, other package architectures may be used. For example, the IC package 180 may be a ball grid array (BGA) package, such as an embedded wafer-level ball grid array (eWLB) package. In another example, the IC package 180 may be a wafer-level chip scale package (WLCSP) or a panel fanout (FO) package. Although two dies 156 are illustrated in the IC package 180 of FIG. 2, an IC package 180 may include any desired number of dies 156. An IC package 180 may include additional passive components, such as surface-mount resistors, capacitors, and inductors disposed on the first face 172 or the second face 174 of the package substrate 151, or on either face of the interposer 157. More generally, an IC package 180 may include any other active or passive components known in the art.

Figure 3A:
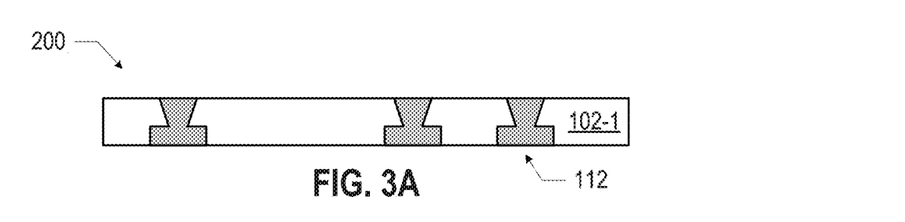
FIGS. 3A-3Q are side, cross-sectional views of assemblies fabricated at various stages in an example process of manufacturing an IC package support including a cavity structure, in accordance with various embodiments.
Figure 3B:
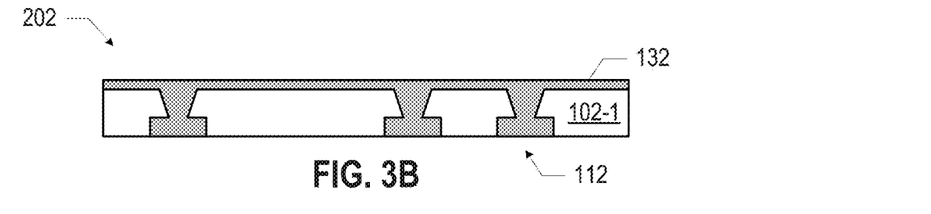
Figure 3C:
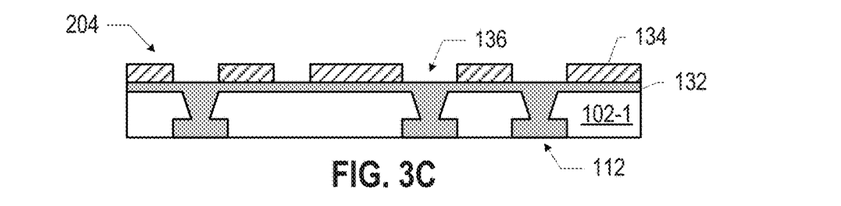
Figure 3D:
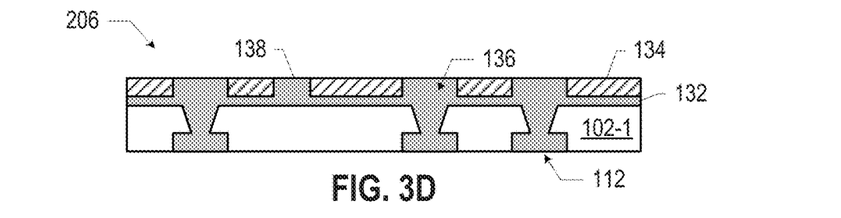
Figure 3E:
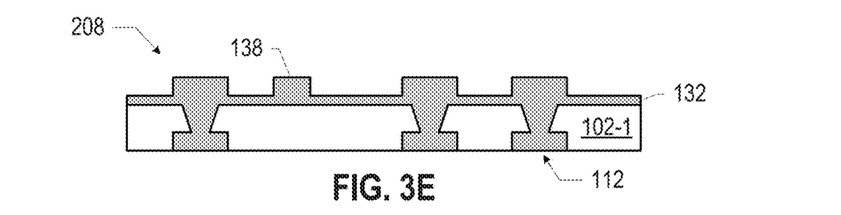
Figure 3F:
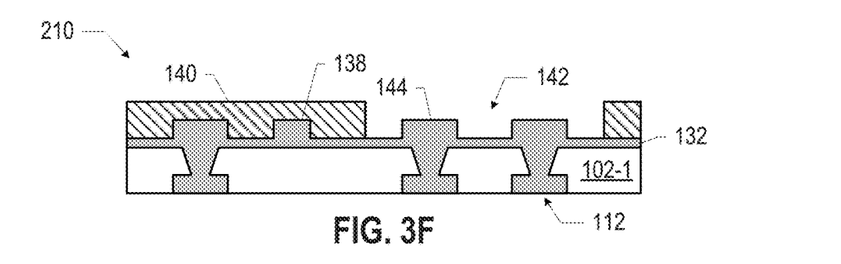
Figure 3G:
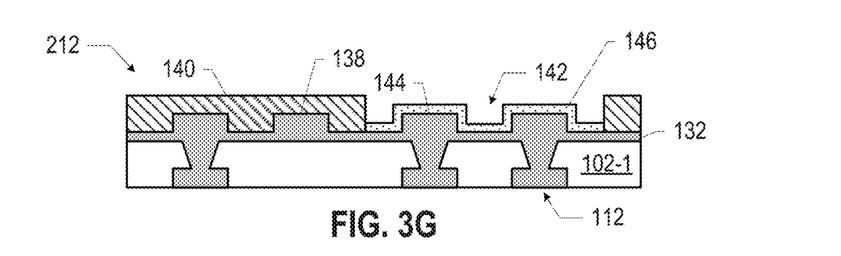
Figure 3H:
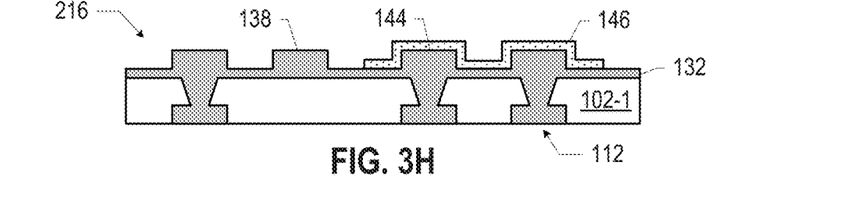
Figure 3I:
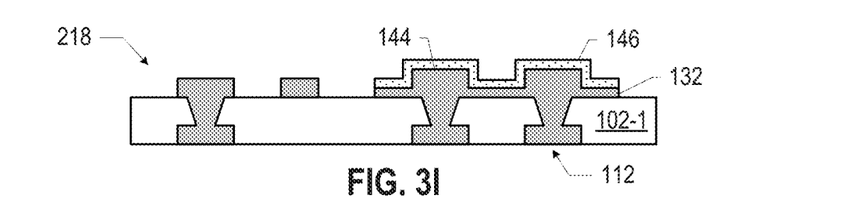
Figure 3J:
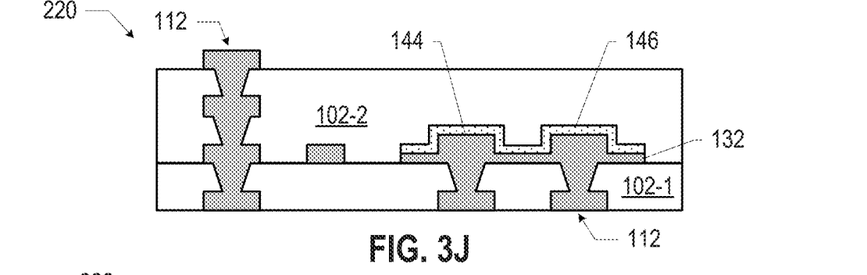
Figure 3K:
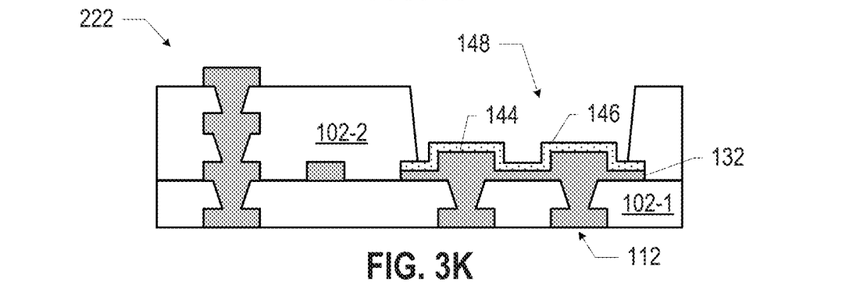
Figure 3L:
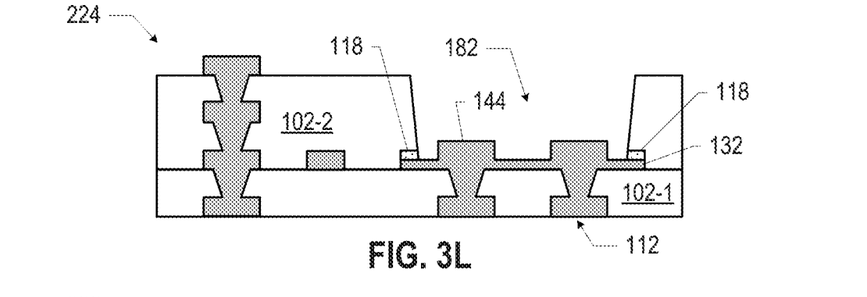
Figure 3M:
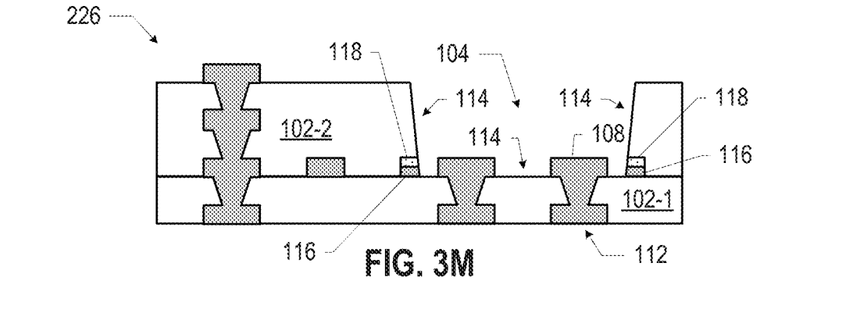
Figure 3N:
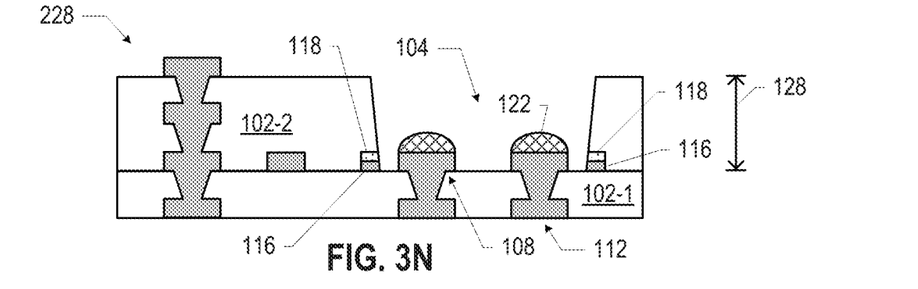
Figure 3O:
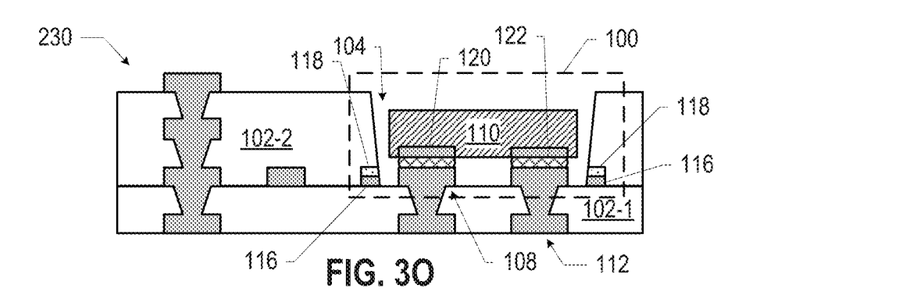
Figure 3P:
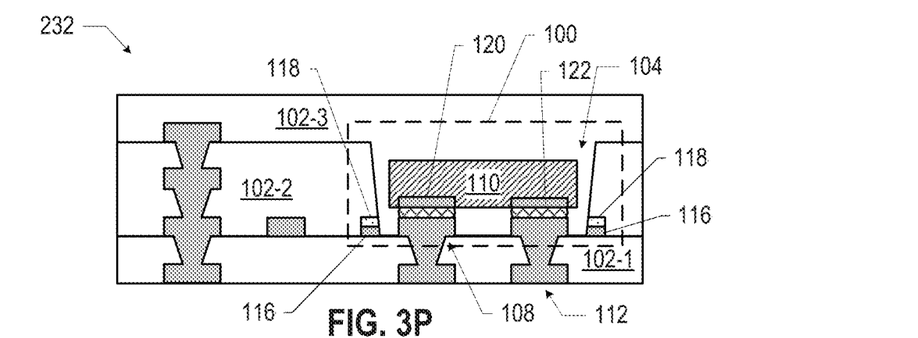
Figure 3Q:
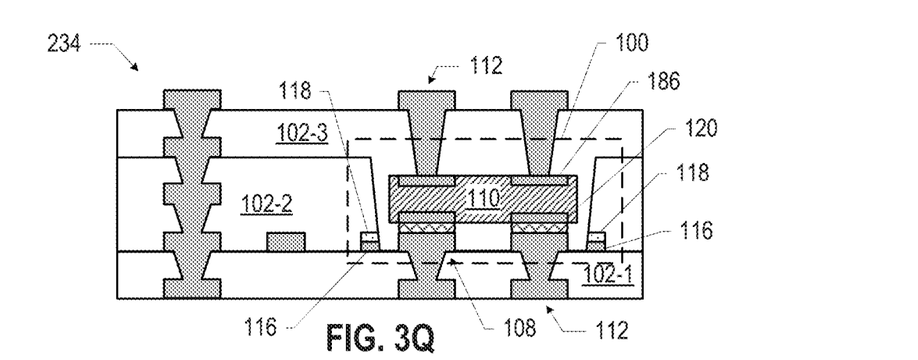

FIGS. 3A-3Q illustrate various stages in the fabrication of an example IC package support 150 including a cavity structure 100. Operations are illustrated once each and in a particular order in FIG. 3, but the operations may be reordered and/or repeated as desired (e.g., with different operations performed in parallel when manufacturing multiple IC package supports 150, or forming multiple cavity structures 100, simultaneously).

FIG. 3A illustrates an assembly 200 including a dielectric material 102-1 and multiple conductive structures 112 through and/or in the dielectric material 102-1. The conductive structures 112 may include conductive vias and/or conductive lines (e.g., in accordance with any of the embodiments discussed below with reference to FIG. 5), and may be formed using any suitable technique (e.g., subtractive patterning, semi-additive patterning, etc.). Some or all of the conductive structures 112 of the assembly 200 may be exposed at the top surface of the assembly 200, as shown.

FIG. 3B illustrates an assembly 202 subsequent to forming a first material layer 132 on the top surface of the assembly 200 (FIG. 3A). The first material layer 132 may be a conductive seed layer for the subsequent deposition of a conductive material (i.e., the conductive material 138, discussed below). In some embodiments, the first material layer 132 may include a metal (e.g., copper), and may be thinly deposited conformally over the top surface of the assembly 200, making contact with exposed conductive structures 112. The thickness of the first material layer 132 may take the form of any of the embodiments of the thickness 126 disclosed herein. Any suitable technique may be used to form the first material layer 132, such as chemical vapor deposition (CVD) or atomic layer deposition (ALD). The material composition of the first material layer 132 may take any of the forms discussed above with reference to the peripheral material 116.

FIG. 3C illustrates an assembly 204 subsequent to depositing and patterning a resist material 134 on the first material layer 132 of the assembly 202 (FIG. 3B). The resist material 134 may be patterned with openings 136 that selectively expose portions of the first material layer 132 at desired locations. The resist material 134 may have any suitable composition, and may be patterned using any suitable technique. For example, the resist material 134 may be a dry film resist (DFR) laminated onto the assembly 202, and may be exposed and developed using a lithographic technique.

FIG. 3D illustrates an assembly 206 subsequent to depositing conductive material 138 in the openings 136 of the resist material 134 of the assembly 204 (FIG. 3C). The conductive material 138 may have the same material composition as the first material layer 132 or a different material composition. In some embodiments, the additional conductive material 138 may include copper. Any suitable technique may be used to deposit the conductive material 138, such as CVD, ALD, physical vapor deposition (PVD), electroless deposition, or electroplating. In some embodiments, a top surface of the assembly 206 may be planarized (e.g., using a chemical mechanical planarization (CMP) technique) after deposition of the conductive material 138.

FIG. 3E illustrates an assembly 208 subsequent to removing the resist material 134 from the assembly 206 (FIG. 3D). Any suitable chemical or mechanical technique for stripping the resist material 134 may be used.

FIG. 3F illustrates an assembly 210 subsequent to depositing and patterning a resist material 140 on the top surface of the assembly 208 (FIG. 3E). The resist material 140 may be patterned with openings 142 that selectively expose portions of the conductive material 138 at desired locations. The exposed portions of the conductive material 138 (i.e., the portions of conductive material 138 in the openings 142) may be referred to herein as intermediate conductive contacts 144. The resist material 140 may have any suitable composition, and may be patterned using any suitable technique. For example, the resist material 140 may be a DFR laminated onto the assembly 208, and may be exposed and developed using a lithographic technique.

FIG. 3G illustrates an assembly 212 subsequent to depositing a second material layer 146 on the exposed conductive material in the openings 142 (i.e., the exposed first material layer 132 and intermediate conductive contacts 144) of the assembly 210 (FIG. 3F). The second material layer 146 may have a different material composition than the first material layer 132 or the intermediate conductive contacts 144, and may serve to protect these underlying materials from damage during subsequent cavity formation (e.g., as discussed below with reference to the cavity 148). For example, the second material layer 146 may act as a laser stop when the cavity 148 is formed by laser drilling. In some embodiments, the second material layer 146 may be formed by electroplating, but other techniques (such as ALD or CVD) may be used. The material composition of the second material layer 146 may take any of the forms discussed above with reference to the peripheral material 118.

FIG. 3H illustrates an assembly 216 subsequent to removing the resist material 140 from the assembly 214 (FIG. 3G). Any suitable chemical or mechanical technique for stripping the resist material 140 may be used.

FIG. 3I illustrates an assembly 218 subsequent to performing a brief and/or shallow "seed etch" on the assembly 216 (FIG. 3H) to remove the portions of the first material layer 132 not protected by the second material layer 146, and also to remove some of the portions of the conductive material 138 not protected by the second material layer 146. The remaining conductive material 138 may provide conductive pads and/or conductive lines. Although various structures may be referred to herein as "pads" or "lines," in some embodiments, pads (on which a via "lands") may be portions of lines, and lines may also serve as pads. As noted above, although a particular number and arrangement of vias, pads, and/or lines is shown in various ones of the accompanying drawings, these arrangements are simply illustrative, and any IC package support 150 may include any suitable arrangement.

FIG. 3J illustrates an assembly 220 subsequent to depositing dielectric material 102-2 on the assembly 218 (FIG. 3I) and forming conductive structures 112 through the dielectric material 102-2 as desired. Any suitable technique may be used to deposit the dielectric material 102-2 and form the conductive structures 112, such as additive patterning, subtractive patterning, or semi-additive patterning. The region of the dielectric material 102-2 above the second material layer 146 may not include any conductive structures 112.

FIG. 3K illustrates an assembly 222 subsequent to forming a cavity 148 in the dielectric material 102-2 of the assembly 220 (FIG. 3J) to expose at least some of the second material layer 146. The cavity 148 may be formed using any suitable technique (e.g., laser drilling, with the second material layer 146 serving as a laser stop) and may have a tapered shape that narrows toward the second material layer 146. Portions of the second material layer 146 may extend laterally beyond the bottom of the cavity 148, and may remain between the dielectric material 102-1 and the dielectric material 102-2; in other words, the footprint of the bottom of the cavity 148 may be "smaller" than the footprint of the second material layer 146. The amount by which the second material layer 146 extends laterally past a proximate sidewall of the cavity 148 may, in some embodiments, take any of the values of the width 130 discussed herein. A desmear process may be performed after formation of the cavity 148.

FIG. 3L illustrates an assembly 224 subsequent to removing the exposed portion of the second material layer 146 from the assembly 222 (FIG. 3K). The exposed portion of the second material layer 146 may be the portion of the second material layer 146 that provided the bottom of the cavity 148; once removed, a new cavity 182 may be present, with its bottom provided by a portion of the first material layer 132. The exposed portion of the second material layer 146 may be removed using any suitable technique, such as a selective etch. Portions of the second material layer 146 that are under the dielectric material 102-2 may remain at the periphery of the cavity 182 in the assembly 224; these portions may provide the peripheral material 118. Portions of the first material layer 132 may extend laterally beyond the bottom of the cavity 182, and may remain between the dielectric material 102-1 and the dielectric material 102-2; in other words, the footprint of the bottom of the cavity 182 may be "smaller" than the footprint of the first material layer 132. The amount by which the first material layer 132 extends laterally past a proximate sidewall of the cavity 182 may, in some embodiments, take any of the values of the width 130 discussed herein.

FIG. 3M illustrates an assembly 226 subsequent to performing a seed etch on the assembly 224 (FIG. 3L) to remove the portions of the first material layer 132 at the bottom of the cavity 182, and also to remove some of the portions of the intermediate contacts 144 at the bottom of the cavity 182. The etched intermediate conductive contacts 144 may be the conductive contacts 108. After the etch, a new cavity 104 may be present, with its bottom provided by a top surface of the dielectric material 102 and the conductive contacts 108. Portions of the first material layer 132 that are under the peripheral material 118 may remain at the periphery of the cavity 104 in the assembly 226; these portions may provide the peripheral material 116.

FIG. 3N illustrates an assembly 228 subsequent to providing solder 122 on the conductive contacts 108 in the cavity 104 of the assembly 226 (FIG. 3M). In some embodiments, the solder 122 may be printed onto the conductive contacts 108 using a step stencil process and a squeegee roller; such embodiments may be particularly appropriate when the depth 128 of the cavity 104 is between 50 microns and 100 microns. In some embodiments, the solder 122 maybe dispensed onto the conductive contacts 108 using a cartridge head or other dispenser; such embodiments may be particularly appropriate when the depth 128 of the cavity 104 is between 100 microns and 150 microns.

FIG. 3O illustrates an assembly 230 subsequent to attaching conductive contacts 120 of an IC component 110 to the conductive contacts 108 via the solder 122 of the assembly 228 (FIG. 3N), followed by a reflow operation. The IC component may take any of the forms disclosed herein. The assembly 230 may take the form of the IC package support 150 of FIG. 1. Although a single IC component 110 is shown as disposed in a cavity 104 in various ones of the accompanying drawings, a single cavity 104 may have multiple IC components 110 at least partially disposed therein.

As noted above, in some embodiments, an IC component 110 in a cavity 104 may have additional dielectric material disposed thereon. For example, FIG. 3P illustrates an assembly 232 subsequent to providing a dielectric material 102-3 on the assembly 230 (FIG. 3O) so that the dielectric material 102-3 covers the IC component 110 and at least partially fills the open regions of the cavity 104 of the assembly 230. In some embodiments, the dielectric material 102-3 may be a buildup film provided on the assembly 230 by lamination. Such embodiments may advantageously protect the IC component 110 from external debris or subsequent fabrication processes, and may be used when the IC component 110 is located at a face of the IC package support 150 or embedded in the IC package support 150 (e.g., as discussed above with reference to FIG. 2).

In some embodiments, an IC component 110 in a cavity 104 may have conductive contacts disposed at opposite faces of the IC component 110, and the IC package support 150 may include conductive structures 112 to electrically couple with these conductive contacts. For example, FIG. 3Q illustrates an assembly 234 that includes an IC component 110 having conductive contacts 186 at the top face of the IC component 110 (as well as conductive contacts 120 at the bottom face of the IC component 110), and conductive structures 112 through the dielectric material 102-3 to make electrical contact with the conductive contacts 186. The assembly 234 may be fabricated by forming the dielectric material 102-3 and the conductive structures 112 therethrough using any suitable technique (e.g., subtractive patterning, semi-additive patterning, additive patterning, etc.). In this manner, an IC package support 150 may include "double-sided" IC components 110 in a cavity 104, and electrical connections to the conductive contacts on the opposing faces of the IC components 110 may be made through the IC package support 150.

The cavity structures 100 and IC package supports 150 disclosed herein may be included in any suitable electronic component. FIGS. 4-7 illustrate various examples of apparatuses that may include any of the cavity structures 100 and IC package supports 150 disclosed herein, or may be included in an IC package that also includes any of the cavity structures 100 and IC package supports 150 disclosed herein.

Figure 4:
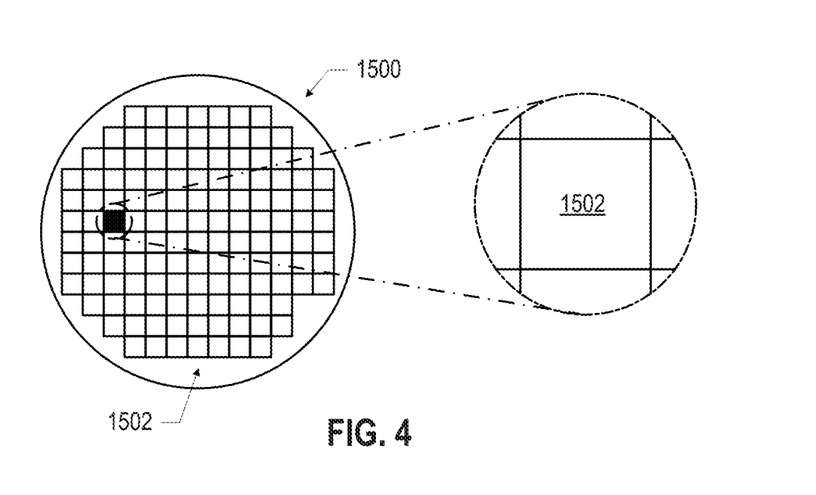
FIG. 4 is a top view of a wafer and dies that may be included in an IC package having an IC package support with a cavity structure, in accordance with any of the embodiments disclosed herein.

FIG. 4 is a top view of a wafer 1500 and dies 1502 that may be included in an IC package including one or more cavity structures 100 and IC package supports 150, in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 5, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 7) or other logic that is configured to store information in the memory devices or execute instructions stored in the memory array.

Figure 5:
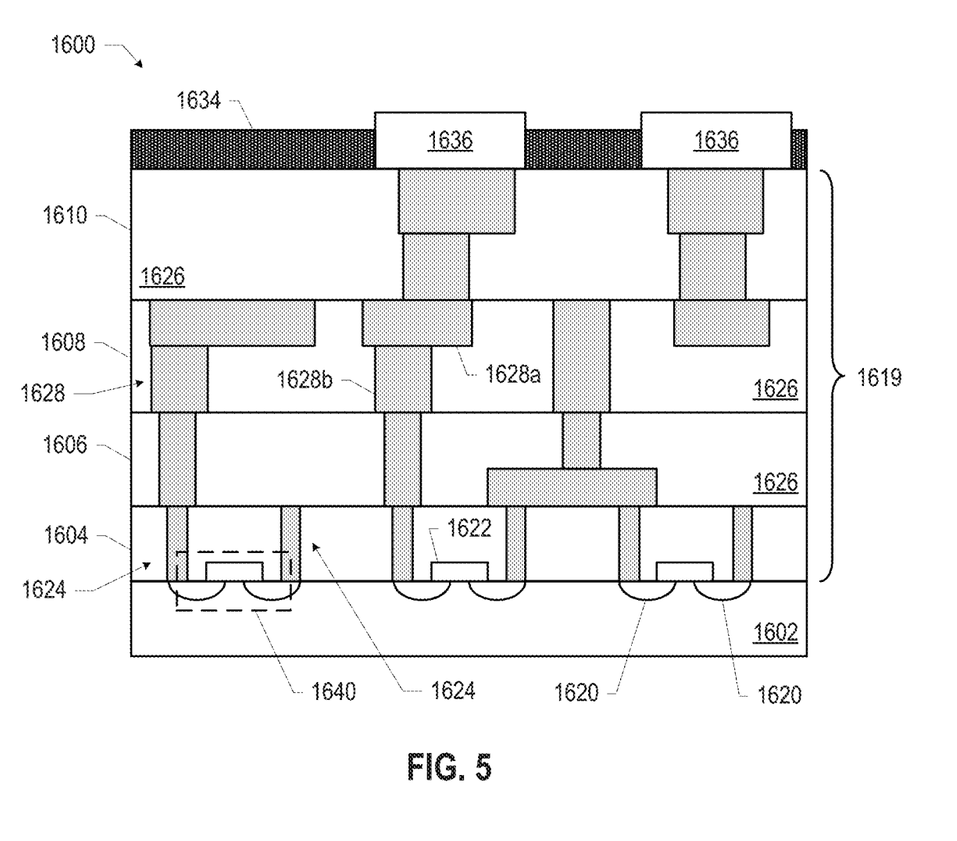
FIG. 5 is a side, cross-sectional view of an IC device that may be included in an IC package having an IC package support with a cavity structure, in accordance with any of the embodiments disclosed herein.

FIG. 5 is a side, cross-sectional view of an IC device 1600 that may be included in an IC package including one or more cavity structures 100 and IC package supports 150, in accordance with any of the embodiments disclosed herein. One or more of the IC devices 1600 may be included in one or more dies 1502 (FIG. 4). The IC device 1600 may be formed on a substrate 1602 (e.g., the wafer 1500 of FIG. 4) and may be included in a die (e.g., the die 1502 of FIG. 4). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 4) or a wafer (e.g., the wafer 1500 of FIG. 4).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 5 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 5 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 5). Although a particular number of interconnect layers 1606-1610 is depicted in FIG. 5, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 5. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 5. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 5, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 6:
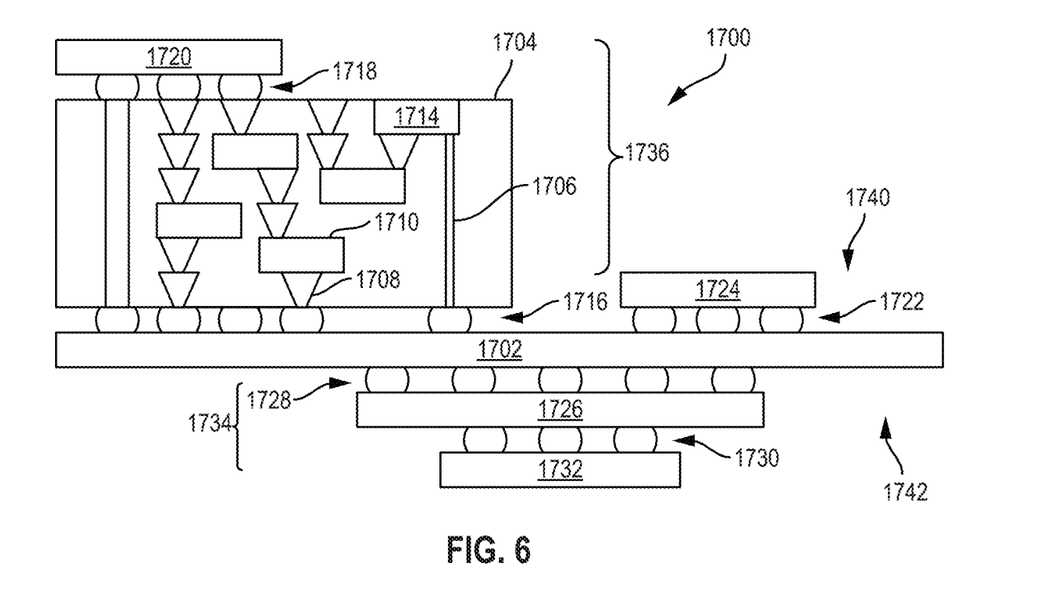
FIG. 6 is a side, cross-sectional view of an IC device assembly that may include an IC package support having a cavity structure, in accordance with any of the embodiments disclosed herein.

FIG. 6 is a side, cross-sectional view of an IC device assembly 1700 that may include one or more IC packages including one or more cavity structures 100 or IC package supports 150, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 180 discussed above with reference to FIG. 2 (e.g., may include one or more cavity structures 100 or IC package supports 150).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 6 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 6), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 6, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 4), an IC device (e.g., the IC device 1600 of FIG. 5), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 6, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal interconnects 1708 and vias 1710, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more cavity structures 100 or IC package supports 150.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 6 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 7:
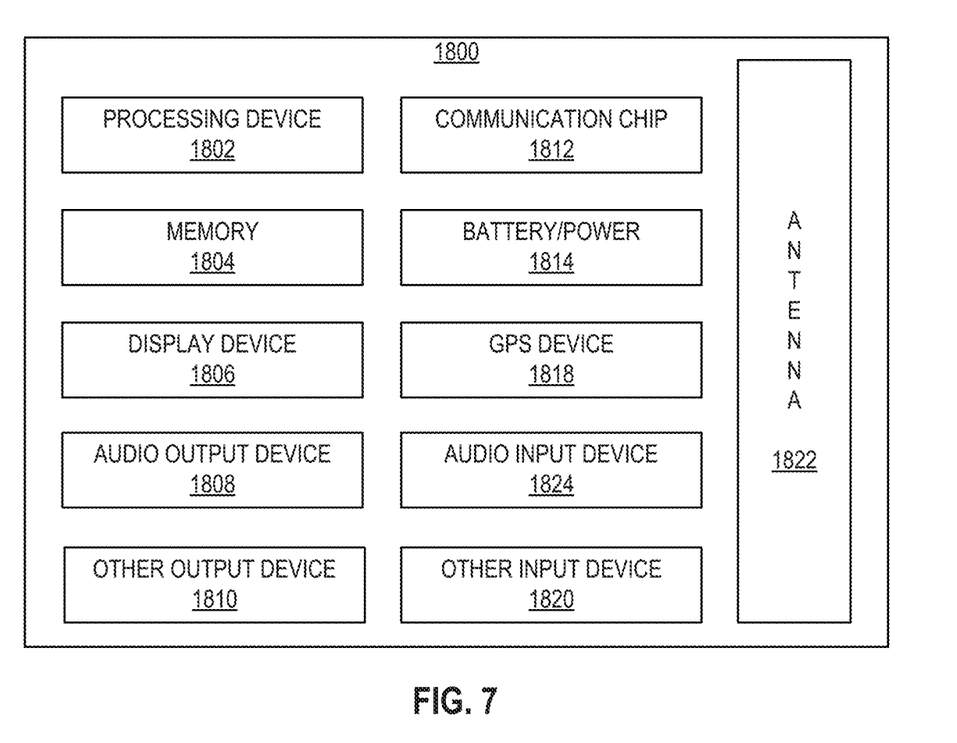
FIG. 7 is a block diagram of an example electrical device that may include an IC package support having a cavity structure, in accordance with any of the embodiments disclosed herein.

FIG. 7 is a block diagram of an example electrical device 1800 that may include one or more cavity structures 100 or IC package supports 150, in accordance with any of the embodiments disclosed herein. For example, any suitable ones of the components of the electrical device 1800 may include one or more of the IC device assemblies 1700, IC packages 180, IC devices 1600, or dies 1502 disclosed herein. A number of components are illustrated in FIG. 7 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 7, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) package support, including: a cavity in a dielectric material, wherein the cavity has a bottom and sidewalls; conductive contacts at the bottom of the cavity, wherein the conductive contacts include a first material; a first peripheral material outside the cavity, wherein the first peripheral material is at the sidewalls of the cavity and proximate to the bottom of the cavity, and the first peripheral material includes the first material; and a second peripheral material outside the cavity, wherein the second peripheral material is at the sidewalls of the cavity and on the first peripheral material, and the second peripheral material is different than the first peripheral material.

Example 2 includes the subject matter of Example 1, and further specifies that the first material includes copper.

Example 3 includes the subject matter of any of Examples 1-2, and further specifies that the second peripheral material includes nickel.

Example 4 includes the subject matter of any of Examples 1-3, and further specifies that the second peripheral material includes tungsten or titanium.

Example 5 includes the subject matter of any of Examples 1-4, and further specifies that a thickness of the first peripheral material is between 0.2 microns and 1.5 microns.

Example 6 includes the subject matter of any of Examples 1-5, and further specifies that a thickness of the second peripheral material is between 5 microns and 15 microns.

Example 7 includes the subject matter of any of Examples 1-6, and further specifies that a thickness of the second peripheral material is greater than 10 microns.

Example 8 includes the subject matter of any of Examples 1-7, and further specifies that a width of the first peripheral material is between 5 microns and 20 microns.

Example 9 includes the subject matter of any of Examples 1-8, and further specifies that a width of the second peripheral material is between 5 microns and 20 microns.

Example 10 includes the subject matter of any of Examples 1-9, and further specifies that a depth of the cavity is between 50 microns and 150 microns.

Example 11 includes the subject matter of any of Examples 1-10, and further specifies that the dielectric material includes one or more layers of buildup film.

Example 12 includes the subject matter of any of Examples 1-11, and further includes: conductive structures in electrical contact with the conductive contacts.

Example 13 includes the subject matter of any of Examples 1-12, and further specifies that a bottom surface of the first peripheral material is coplanar with a bottom surface of the conductive contacts.

Example 14 includes the subject matter of any of Examples 1-13, and further specifies that the IC package support is a package substrate.

Example 15 includes the subject matter of any of Examples 1-13, and further specifies that the IC package support is an interposer.

Example 16 includes the subject matter of any of Examples 1-15, and further includes: an IC component in the cavity, wherein conductive contacts of the IC component are coupled to the conductive contacts.

Example 17 includes the subject matter of Example 16, and further specifies that the IC component includes a capacitor or an inductor.

Example 18 includes the subject matter of Example 16, and further includes: dielectric material on the IC component and in the cavity.

Example 19 includes the subject matter of any of Examples 1-18, and further specifies that the cavity is at a face of the IC package support.

Example 20 includes the subject matter of any of Examples 1-18, and further specifies that the cavity is internal to the IC package support.

Example 21 is an integrated circuit (IC) package, including: an IC package support, including a cavity having conductive contacts disposed at a bottom of the cavity, wherein the conductive contacts are on a surface of a layer of dielectric material, an IC component in the cavity, wherein conductive contacts of the IC component are coupled to the conductive contacts by solder, and a peripheral material on the surface of the layer of dielectric material and extending around the bottom of the cavity.

Example 22 includes the subject matter of Example 21, and further specifies that the peripheral material has a thickness between 5 microns and 20 microns.

Example 23 includes the subject matter of any of Examples 21-22, and further specifies that the peripheral material includes a first material on the surface of the layer of dielectric material and a second material on the first material, and wherein the first material is different than the second material.

Example 24 includes the subject matter of Example 23, and further specifies that the first material includes copper.

Example 25 includes the subject matter of any of Examples 23-24, and further specifies that the second material includes nickel.

Example 26 includes the subject matter of any of Examples 23-25, and further specifies that the second material includes tungsten or titanium.

Example 27 includes the subject matter of any of Examples 23-26, and further specifies that a thickness of the first material is between 0.2 microns and 1.5 microns.

Example 28 includes the subject matter of any of Examples 23-28, and further specifies that a thickness of the second material is between 5 microns and 15 microns.

Example 29 includes the subject matter of any of Examples 23-28, and further specifies that a thickness of the second material is greater than 10 microns.

Example 30 includes the subject matter of any of Examples 23-29, and further specifies that a width of the peripheral material is between 5 microns and 20 microns.

Example 31 includes the subject matter of any of Examples 21-30, and further specifies that a depth of the cavity is between 50 microns and 150 microns.

Example 32 includes the subject matter of any of Examples 21-31, and further specifies that the IC component is a packaged component.

Example 33 includes the subject matter of any of Examples 21-32, and further specifies that the IC component is a multi-layer ceramic capacitor.

Example 34 includes the subject matter of any of Examples 21-32, and further specifies that the IC component is a chip capacitor.

Example 35 includes the subject matter of any of Examples 21-32, and further specifies that the IC component is an inductor.

Example 36 includes the subject matter of any of Examples 21-35, and further specifies that the layer of dielectric material is a first layer of dielectric material, the conductive contacts of the IC component are first conductive contacts at a first face of the IC component, the IC component further includes second conductive contacts at a second face of the IC component, the second face is opposite to the first face, and the IC package further includes: a second layer of dielectric material, wherein the IC component is between the first layer of dielectric material and the second layer of dielectric material; and conductive structures through the second layer of dielectric material, wherein the conductive structures are in electrical contact with the second conductive contacts.

Example 37 includes the subject matter of any of Examples 21-36, and further specifies that the IC package support further includes conductive contacts for first-level interconnects at a face of the package support, and the cavity is at the face.

Example 38 includes the subject matter of any of Examples 21-36, and further specifies that the package support further includes conductive contacts for second-level interconnects at a face of the package support, and the cavity is at the face.

Example 39 includes the subject matter of any of Examples 21-38, and further specifies that the IC package support is a package substrate.

Example 40 includes the subject matter of any of Examples 21-38, and further specifies that the IC package support is an interposer.

Example 41 includes the subject matter of any of Examples 21-39, and further includes: one or more IC dies coupled to a face of the IC package support.

Example 42 is a computing device, including: a circuit board; and an integrated circuit (IC) package coupled to the circuit board, wherein the IC package includes an IC package support having conductive contacts located away from a face of the IC package support, an IC component coupled to the conductive contacts, and a peripheral material proximate to the conductive contacts, wherein the peripheral material includes a metal and is insulated from power, ground, and signal pathways through the IC package support.

Example 43 includes the subject matter of Example 42, and further specifies that the peripheral material has a thickness between 5 microns and 20 microns.

Example 44 includes the subject matter of any of Examples 42-43, and further specifies that the peripheral material includes a first material on a surface of a layer of dielectric material and a second material on the first material, and wherein the first material is different than the second material.

Example 45 includes the subject matter of Example 44, and further specifies that the first material includes copper.

Example 46 includes the subject matter of any of Examples 44-45, and further specifies that the second material includes nickel.

Example 47 includes the subject matter of any of Examples 44-46, and further specifies that the second material includes tungsten or titanium.

Example 48 includes the subject matter of any of Examples 44-47, and further specifies that a thickness of the first material is between 0.2 microns and 1.5 microns.

Example 49 includes the subject matter of any of Examples 44-48, and further specifies that a thickness of the second material is between 5 microns and 15 microns.

Example 50 includes the subject matter of any of Examples 44-49, and further specifies that a thickness of the second material is greater than 10 microns.

Example 51 includes the subject matter of any of Examples 44-50, and further specifies that a width of the peripheral material is between 5 microns and 20 microns.

Example 52 includes the subject matter of Example 42, and further specifies that the IC component is in a cavity in a dielectric material, and a depth of the cavity is between 50 microns and 150 microns.

Example 53 includes the subject matter of any of Examples 42-52, and further specifies that the IC component is a packaged component.

Example 54 includes the subject matter of any of Examples 42-53, and further specifies that the IC component includes a multi-layer ceramic capacitor.

Example 55 includes the subject matter of any of Examples 42-54, and further specifies that the IC component includes a chip capacitor.

Example 56 includes the subject matter of any of Examples 42-55, and further specifies that the IC component includes an inductor.

Example 57 includes the subject matter of any of Examples 42-56, and further specifies that the circuit board is a motherboard.

Example 58 includes the subject matter of any of Examples 42-57, and further specifies that the computing device is a handheld computing device.

Example 59 includes the subject matter of any of Examples 42-57, and further specifies that the computing device is a server computing device.

Example 60 includes the subject matter of any of Examples 42-59, and further specifies that the IC package further includes one or more dies coupled to the face of the IC package support.

Example 61 includes the subject matter of any of Examples 42-60, and further includes: a display device communicatively coupled to the circuit board.

Example 62 includes the subject matter of any of Examples 42-61, and further includes: wireless communication circuitry communicatively coupled to the circuit board.

Example 63 is a method of manufacturing an integrated circuit (IC) package support, including: forming a set of conductive contacts on a first dielectric material; forming a metal seed layer over the set of conductive contacts; forming a resist material over the metal seed layer; forming an opening in the resist material over the set of conductive contacts to expose a first portion of the metal seed layer; forming a protective material over the exposed first portion of the metal seed layer; removing the resist material; forming a second dielectric material over the protective material; forming an opening in the second dielectric material to expose a portion of the protective material; removing the exposed portion of the protective material to expose a second portion of the metal seed layer; and removing the exposed second portion of the metal seed layer.

Example 64 includes the subject matter of Example 63, and further specifies that forming the opening in the second dielectric material includes laser drilling, and the protective material serves as a laser stop.

Example 65 includes the subject matter of any of Examples 63-64, and further specifies that the protective material includes nickel, tungsten, or titanium.

Example 66 includes the subject matter of any of Examples 63-65, and further includes: after removing the exposed second portion of the metal seed layer, coupling an IC component to the set of conductive contacts.

Example 67 includes the subject matter of Example 66, and further includes: after coupling the IC component to the set of conductive contacts, forming a third dielectric material over the IC component.

Example 68 includes the subject matter of Example 67, and further includes: after forming the third dielectric material over the IC component, forming conductive structures through the third dielectric material to make contact with additional conductive contacts of the IC component.

The invention claimed is:

1. An integrated circuit (IC) package support, comprising:
   a cavity in a dielectric material, wherein the cavity has a bottom surface and sidewalls, wherein the sidewalls include a first peripheral material proximate to the bottom surface of the cavity, a second peripheral material on the first peripheral material, and the dielectric material on the second peripheral material, and wherein the second peripheral material is different than the first peripheral material; and
   conductive contacts at the bottom surface of the cavity, wherein the conductive contacts include the first peripheral material.

2. The IC package support of claim 1, wherein the first peripheral material includes copper.

3. The IC package support of claim 1, wherein the second peripheral material includes nickel, tungsten or titanium.

4. The IC package support of claim 1, wherein a thickness of the first peripheral material is between 0.2 microns and 1.5 microns.

5. The IC package support of claim 1, wherein a thickness of the second peripheral material is between 5 microns and 15 microns.

6. The IC package support of claim 1, wherein a depth of the cavity is between 50 microns and 150 microns.

7. The IC package support of claim 1, further comprising:
   conductive structures in electrical contact with the conductive contacts.

8. The IC package support of claim 1, wherein a bottom surface of the first peripheral material is coplanar with a bottom surface of the conductive contacts.

9. The IC package support of claim 1, wherein the IC package support is a package substrate or an interposer.

10. The IC package support of claim 1, further comprising:
- an IC component in the cavity, wherein conductive contacts of the IC component are coupled to the conductive contacts.

11. An integrated circuit (IC) package, comprising:
an IC package support, including:
- a cavity having a bottom surface and sidewalls, the cavity including conductive contacts disposed at the bottom surface of the cavity, wherein the bottom surface of the cavity is a surface of a layer of dielectric material, and wherein the sidewalls include a peripheral material on the surface of the layer of dielectric material; and
- an IC component in the cavity, wherein conductive contacts of the IC component are electrically coupled by solder to the conductive contacts at the bottom surface of the cavity.

12. The IC package of claim 11, wherein the IC component is a packaged component.

13. The IC package of claim 11, wherein the IC component is a multi-layer ceramic capacitor, a chip capacitor, or an inductor.

14. The IC package of claim 11, wherein the IC package support further includes conductive contacts for first-level interconnects at a face of the IC package support, and the cavity is at the face.

15. The IC package of claim 11, wherein the IC package support further includes conductive contacts for second-level interconnects at a face of the package support, and the cavity is at the face.

16. A computing device, comprising:
a circuit board; and
an integrated circuit (IC) package coupled to the circuit board, wherein the IC package includes:
- an IC package support having a cavity with a bottom surface and sidewalls, the cavity including conductive contacts at the bottom surface of the cavity, and the sidewalls of the cavity including a peripheral material proximate to the bottom surface of the cavity, wherein the a peripheral material includes a metal and is insulated from power, ground, and signal pathways through the IC package support; and
- an IC component electrically coupled to the conductive contacts at the bottom surface of the cavity.

17. The computing device of claim 16, wherein the circuit board is a motherboard.

18. The computing device of claim 16, wherein the computing device is a handheld computing device or a server computing device.

19. The computing device of claim 16, wherein the IC package further includes one or more dies coupled to the face of the IC package support.

20. The computing device of claim 16, further comprising:
- a display device communicatively coupled to the circuit board or
- wireless communication circuitry communicatively coupled to the circuit board.

* * * * *

UNITED STATES PATENT AND TRADEMARK OFFICE
CERTIFICATE OF CORRECTION

PATENT NO. : 11,557,489 B2
APPLICATION NO. : 16/113109
DATED : January 17, 2023
INVENTOR(S) : Rahul Jain et al.

It is certified that error appears in the above-identified patent and that said Letters Patent is hereby corrected as shown below:

In the Claims

In Column 24, Claim 16, Line 14, delete "the a," and insert -- the --, therefor.

Signed and Sealed this
Twenty-eighth Day of February, 2023

Katherine Kelly Vidal
*Director of the United States Patent and Trademark Office*